United States Patent
Taskar et al.

(10) Patent No.: US 6,734,465 B1
(45) Date of Patent: May 11, 2004

(54) NANOCRYSTALLINE BASED PHOSPHORS AND PHOTONIC STRUCTURES FOR SOLID STATE LIGHTING

(75) Inventors: Nikhil R. Taskar, Scarsdale, NY (US); Rameshwar Nath Bhargava, Briarcliff Manor, NY (US)

(73) Assignee: Nanocrystals Technology LP, Briarcliff Manor, NY (US)

( * ) Notice: Subject to any disclaimer, the term of this patent is extended or adjusted under 35 U.S.C. 154(b) by 0 days.

(21) Appl. No.: 10/299,410

(22) Filed: Nov. 19, 2002

Related U.S. Application Data

(60) Provisional application No. 60/331,683, filed on Nov. 19, 2001, and provisional application No. 60/379,726, filed on May 10, 2002.

(51) Int. Cl.[7] .......................... H01L 27/15; H01L 31/12; H01L 33/00
(52) U.S. Cl. ......................................... 257/80; 257/100
(58) Field of Search ..................................... 257/80, 100

(56) References Cited

U.S. PATENT DOCUMENTS

| | | | |
|---|---|---|---|
| 5,777,433 A | 7/1998 | Lester | |
| 5,882,779 A | * 3/1999 | Lawandy | ..................... 428/323 |
| 6,245,259 B1 | 6/2001 | Hohn | |
| 6,417,019 B1 | 7/2002 | Mueller | |
| 6,515,314 B1 | * 2/2003 | Duggal et al. | ............... 257/184 |
| 2002/0085601 A1 | * 7/2002 | Wang et al. | .................. 372/43 |

* cited by examiner

*Primary Examiner*—David Nelms
*Assistant Examiner*—Tu-Tu Ho
(74) *Attorney, Agent, or Firm*—William L. Botjer

(57) ABSTRACT

A photonic structure for "white" light generation by phosphors under the excitation of a LED. The photonic structure mounts the LED and an optically transparent matrix having dispersed therein phosphors which will emit light under the excitation of the radiation of the LED. The transparent matrix may include nanoparticles for matching the index of refraction of the material of the matrix to that of the light generating phosphors. The matrix material may be readily formed by molding and formed into a variety of shapes including lenses for focusing the emitted light. A large number of the photonic structures may be arranged on a substrate to provide even illumination or other purposes. The phosphors dispersed in the matrix are preferably nanocrystalline.

24 Claims, 8 Drawing Sheets

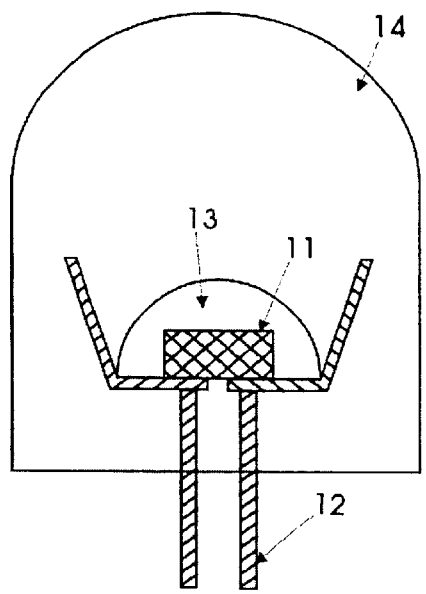
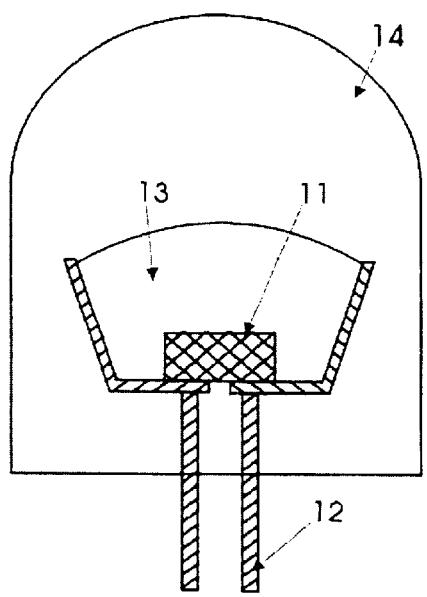
Figs 2
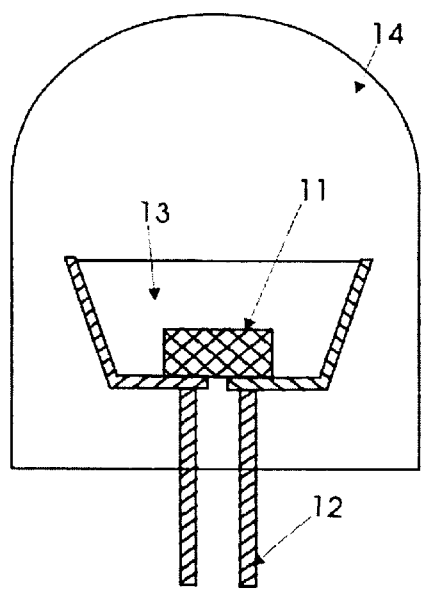
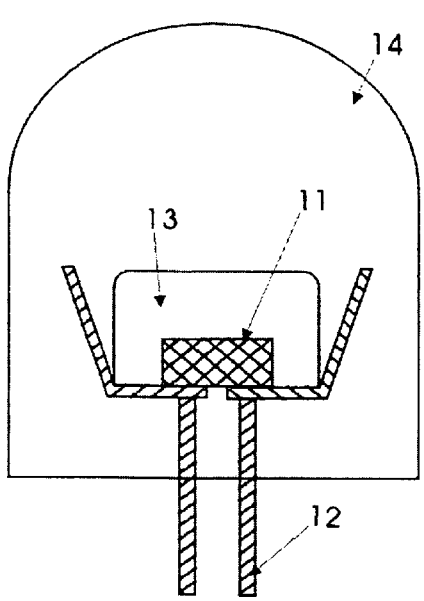

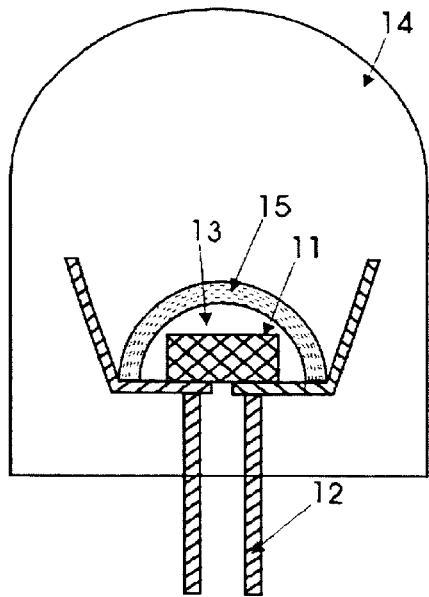
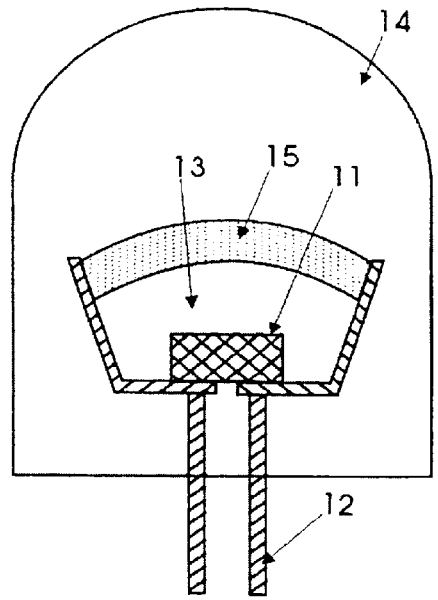
Figs 4
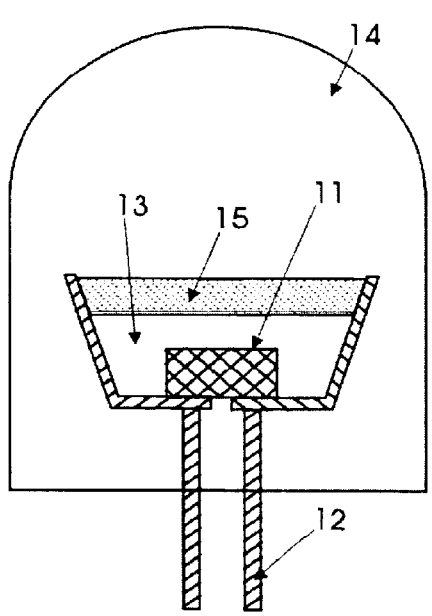
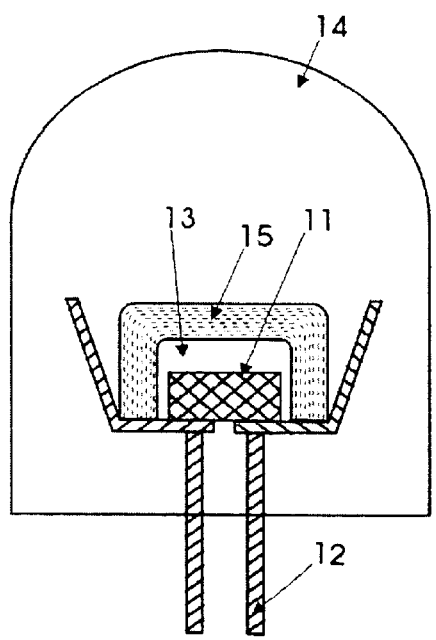

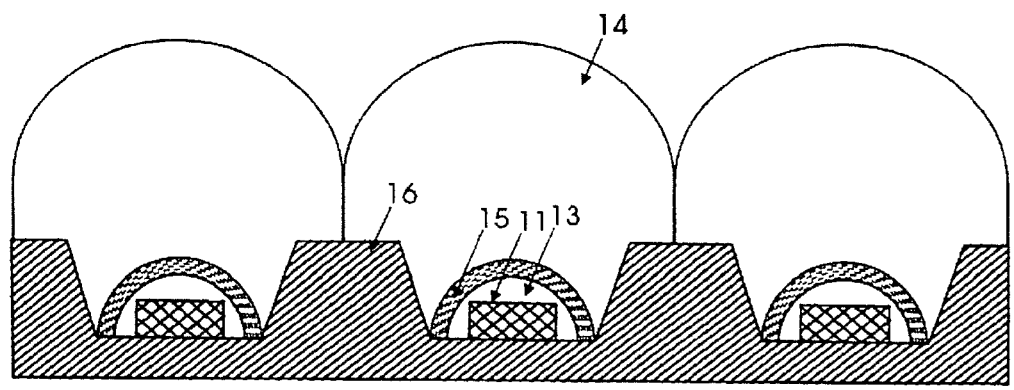
Figs 6
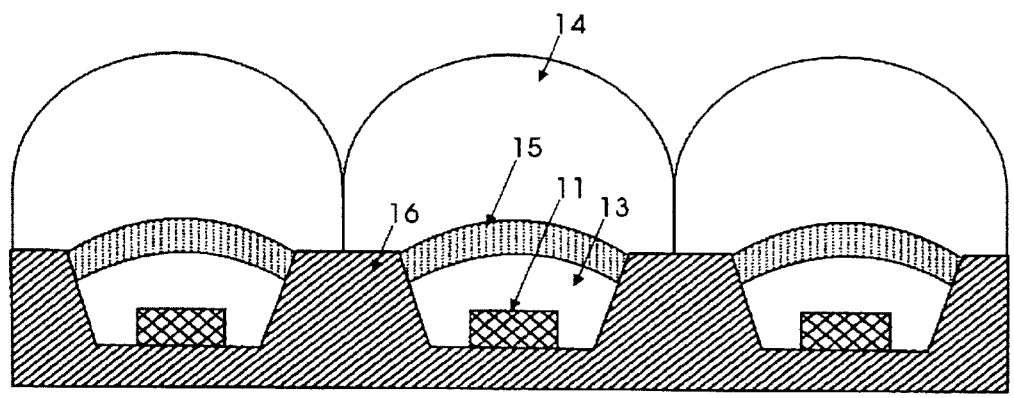

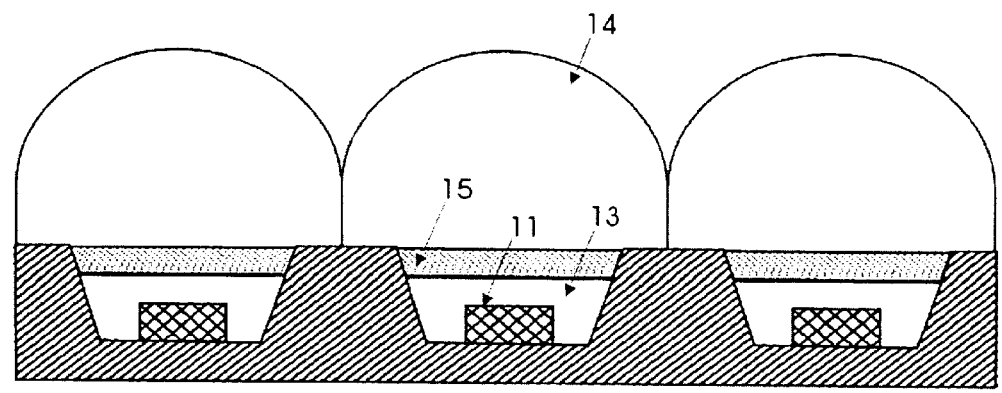
Figs 7
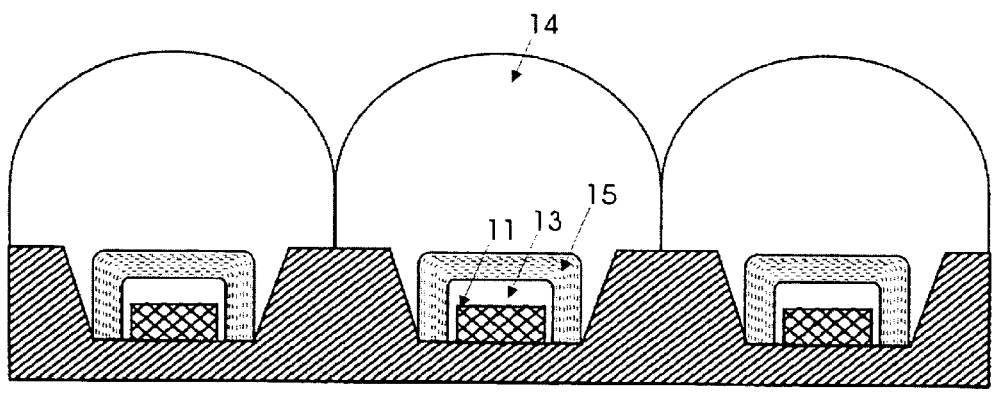

NANOCRYSTALLINE BASED PHOSPHORS AND PHOTONIC STRUCTURES FOR SOLID STATE LIGHTING

REFERENCE TO RELATED APPLICATIONS

This application claims the priority of U.S. Provisional patent application Ser. No. 60/331,683 filed Nov. 19, 2001 and U.S. Provisional patent application Ser. No. 60/379,726 filed May 10, 2002.

BACKGROUND AND SUMMARY OF THE INVENTION

This invention relates generally to solid state lighting applications and specifically to nanocrystalline based phosphors suitable for excitation by Light Emitting Diodes (LED's) and photonic lighting devices based thereon.

Because of their energy efficiency, LED's have recently been proposed for lighting applications, particularly for specialty lighting applications, where energy inefficient incandescent and halogen lights are the norm. To date, three main approaches have been taken to provide so called "white" light from LED's. The first approach uses clusters of red, green and blue (RGB) LED's, with color mixing secondary-optics, to produce white light. This approach does provide good quality white light with a "color rendering index" (CRI) of ~85 and is energy efficient, however, the need to drive three separate sets of LED's requires complex and more expensive driver circuitry. The complexity arises due to considerably different extent of degradation in efficiency with increasing temperature, for each of the red, green and blue LEDs and to different degradation lifetimes between the red, green and blue LEDs. Furthermore, high-brightness (5 mW to 1000 mW LED lamp) blue and green LED's have only recently been developed and are expensive when compared to red LED's.

A second approach to the generation of white light by LED's is the use of a high-brightness blue LED (450 nm to 470 nm) to energize a yellow phosphor, such as Yttrium aluminum garnet doped with cerium (YAIG:Ce called "YAG"). While this approach is energy efficient, low cost and manufacturable, it provides a lower quality white light with color temperature (CT) of ~7000 K and CRI of ~70 to 75, which is not acceptable for many high quality applications. The use of a thicker phosphor layer to absorb and down-convert more of the blue emission, can lower the color temperature and thereby improve the quality of white light. However, this results in a lower energy efficiency. Alternately, using a single or multiple phosphors with red emission in addition to yellowish-green (or greenish-yellow) emission can increase the color rendering index and thereby improve the quality of white light yielding a CT of ~4000 K and CRI of ~80 to 85 but with lower energy efficiency. However, optical efficiency of the phosphor containing package is only about 50%, resulting in decreased light extraction in each of the above cases.

A third approach to the generation of white light by LED's is the use of a high-brightness UV/violet LED (emitting 370–430 nm radiation) to energize RGB phosphors. This approach provides high quality white light with CRI of ~90 or higher, is low cost and is reliable to the extent that the encapsulant in the package, containing/surrounding the phosphor and LED chip/die does not degrade in the presence of UV/violet emission. This is due to shorter degradation lifetimes and a larger decrease in efficiency with increasing ambient temperature, for red LED chips compared to UV/violet or blue LED chips, which leads to greater color-maintenance problems and requires more complex driver circuitry. However, at present this approach has very poor efficiency because of the poor light conversion efficiency of the UV/violet excitable RGB phosphors currently in use. In addition, the optical efficiency of the phosphor containing package is only about 50%, resulting in a further decrease in light extraction.

The present invention is directed to providing nano sized RGB (and any other visible wavelength emitting.) UV/violet excitable phosphors or RG (and any other visible wavelength emitting) Blue excitable phosphors of a higher light down conversion efficiency, which in turn provides a higher energy efficiency from a lighting system based on UV/blue LED's (370 nm to 470 nm).

In conventional activator-based phosphors, the absorption of the exciting radiation is primarily provided by the host while the activator generally dictates the characteristic emission. Because the excited electrons are transferred from host to the activator, the emission characteristics (e.g. emission wavelength) are not so critically dependent on the host, yet the absorption, oscillator strength, efficiency etc. are critically dependent on the host.

Currently used phosphors were developed and optimized over the past 30 years for two major applications. (1) Fluorescent lamps that utilize 254 nm UV radiation from Hg discharge and (2) For CRTs where the RGB-phosphors were excited with an electron beam. In both the cases the emphasis was on the phosphor efficiency of the characteristic radiation, which depends critically on the efficient transfer of the host electron to the activator. One major requirement on the activator was that it must be a localized impurity so as to yield narrow emission (line-emitter). The fact that the localized impurities (e.g. rare-earth metals) are extensively used for this purpose, overall luminescent efficiency (transition rate) remain critically dependent on the host crystalline structure (symmetry and selection rules) and the electronic structure (crystal field splitting) of the localized atom.

The present invention is directed to a photonic structure for "white" light generation by phosphors under the excitation of a LED. The photonic structure mounts the LED and an optically transparent matrix having dispersed therein phosphors which will emit light under the excitation of the radiation of the LED. The transparent matrix may include nanoparticles for matching the index of refraction of the material of the matrix to that of the light generating phosphors. The matrix material may be readily formed by molding and formed into a variety of shapes including lenses for focusing the emitted light. A large number of the photonic structures may be arranged on a substrate to provide even illumination or other purposes. The phosphors dispersed in the matrix are preferably nanocrystalline.

The present invention provides:

A High refractive index (>1.8, ~1.9), optically clear, transfer moldable encapsulating lens
  Dimensions larger than ~1 cm are achievable
  Encapsulation of InGaN (Blue/violet/green)& AlInGaP (red/yellow) saturated color LED dies.
  Encapsulation of white LED lamps containing an InGaN LED die and conventional phosphors A QCA nanophosphor photoluminescent downconverter:
  QCA nanophosphors with brightness equal to, or greater than, conventional phosphors
  Line and Broadband emitting QCA nanophosphors
  Optically transparent and transfer moldable photoluminescent downconverters excitable in the 370 nm to 470 nm wavelength regime Self-assembled structures with sub-wavelength dimensions, formed using QCA nanophosphors, as an enabler for photonic bandgap structures A downconverter for high-power, high-flux LED lamps, capable of operating with excitation LED die/chip junction temperature in excess of 80C and excitation intensity well in excess of $10^{20}$ tons per $cm^2$ per sec.

BRIEF DESCRIPTION OF THE DRAWINGS

For a better understanding of the invention, reference is made to the following drawings which are to be taken in conjunction with the detailed description to follow in which:

FIGS. 2, 3 and 4 of the drawings illustrate additional configurations of a light emitting device constructed in accordance with the present invention, using nanophosphor downconverters; and FIGS. 5, 6, 7, 8 and 9 of the drawings illustrate additional configurations of a light emitting device, constructed in accordance with the present invention, implemented on a substrate containing a multiplicity of individual LED modules.

DESCRIPTION OF THE PREFERRED EMBODIMENTS

Modalities of Operation

Figure 1:
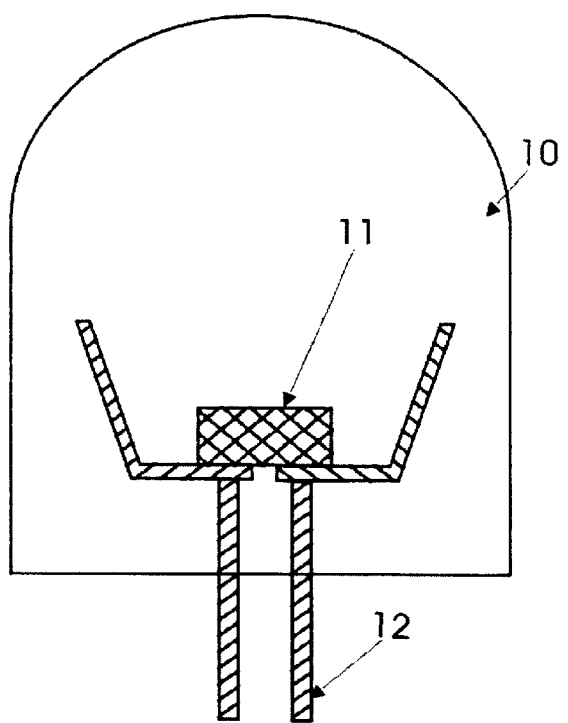
FIG. 1 of the drawings illustrates a first configuration of a light emitting device constructed in accordance with the present invention, using a nanophosphor downconverter.

The present invention is applicable to various modalities of LED/phosphor operation including: a blue LED with a yellowish (or RG) phosphor; RGB phosphors with a UV LED and deep UV LED with "white" fluorescent tube type phosphors. The invention is also applicable to use with various sizes of phosphors: "bulk" micron sized phosphors, nanocrystalline phosphors ("nanophosphors"—less than 100 nm in average diameter and more preferably less than 40 nm) and the newly developed Quantum Confined Atoms (QCA) based nanophosphors which have average diameters of less than 10 nm, which are explained in detail below.

Bulk phosphors are efficient when their phosphor-grain size exceeds 1 um. QCA-Nanophosphors can exist in the form of individual nanoparticles (<10 nm) and can also exist in the form of optically-nonscattering agglomerates (<40 nm), comprised of individual nanoparticles. QCA-Nanophosphors can also exist in the form of optically scattering (>40 nm) micron sized agglomerates comprised of individual nanoparticles, comparable in size to bulk phosphors. The QCA-Nanophosphor agglomerates can have as much as ~50% voids, with every ~10 nm to 40 nm void filled by air or matrix material that the agglomerate is incorporated in. Thus the density and refractive-index (RI) of the agglomerate is lower than that of a similarly sized bulk phosphor. For example in case of YAG, RI of the host is 1.8. The agglomerate will have an average RI of ~1.4 (if it includes air filled voids) or 1.65 (if the matrix with RI=1.5 fills the voids), compared to bulk phosphor with a RI=1.8.

The present invention encapsulates the phosphors in an optically transparent matrix which is important for providing efficiency. The conditions (for a matrix or encapsulant) for achieving a transparent downconverter are as follows: When QCA-Nanophosphors are present as individual nanoparticles in a matrix there is no restriction on the refractive index (RI) of the matrix, using standard epoxy or silicone with an RI from 1.3 to 1.5 will work and so will an High-RI (greater than 1.5) encapsulant. When QCA-Nanophosphors are present as optically-nonscattering agglomerates in a matrix there is also no restriction on the refractive index of the matrix (standard epoxy or silicone with RI from 1.3 to 1.5 will work and so will an high RI encapsulant) When QCA-Nanophosphors are present as optically scattering agglomerates in a matrix this requires a matrix material with an RI equal to that of agglomerate's average RI. This requires a high RI matrix with RI=1.65 or a standard epoxy with RI=1.4 for QCA-Nanophosphors with air filled voids. In contrast bulk phosphors require a high RI matrix with the RI equal to that of the host, for example an RI of approximately 1.8.

OCA Based Phosphors

In order to develop a new generation of phosphors that can be excited between 370 nm to 470 nm for a new generation of solid state lighting, a new class of hosts and activators have been developed. These new phosphors are based upon the recent discovery of Quantum Confined Atoms (QCA) and can be used in this invention. In QCA's, the activator ion is confined in a nanocrystal (quantum dot) of a semiconductor or insulator such that the properties of the activator-ion are modified in controllable manner. In QCA phosphors the following steps are taken to design phosphors that are efficient for excitation in the range of 370 nm to 470 nm.

1. The activator is chosen such that it is a localized luminescent center with a well defined electronic transition. For example the line-emitter like trivalent rare-earth elements or broad band emitters like divalent rare-earth (e.g. Eu2+) or transition metals (e.g. Mn2+). The emission spectral-shapes for these activators remains somewhat invariant in different hosts.
2. The quantum confinement of the atoms in nano-crystalline host is utilized to create new impurity-associated broadband absorption-bands with allowed transition-matrix-element These new confined states yield large absorption band-widths with enhanced oscillator strength in the wavelength region of interest. As a result, the absorption efficiency may be more tolerant with respect to variation in the excitation wavelength. (For Example: Our nano-YAG:Ce shows broader absorption of excitation between 420 nm to 470 nm, compared to bulk-YAG:Ce)
3. The absorption is dependent to a greater extent on the impurity in the nano-cage rather than on the host crystalline structure. The confinement modulates this absorption significantly such that the atom in the cage is acting as a super atom. The giant oscillator strength depends on the size of the nano-crystalline host.
4. The transfer of energy from the host to atom is very efficient since the overlap of the density of states of the host and activator ion has increased significantly in a QCA.
5. While the absorption is modified significantly (enhanced) within the atomic sub-bands, the emission characteristics (wavelength and line-width) remain mostly invariant (For Example: Our nano-YAG:Ce shows a Blue-shifted emission compared to bulk-YAG:Ce broadband emission). For example, one may be able to design nanophosphors which have enhanced absorption in the range of 370 nm to 470 nm and emit the characteristic line emission ($Tb^{3+}$) without the loss of efficiency.
6. This leads to very efficient emission under optical excitation.
7. The phosphor emission efficiency is also temperature insensitive, and does not exhibit any decrease in efficiency even at temperatures in excess of 100C to 150C above room temperature.

8. The emission decay times of the QCA are typically in the nano-second regime, which are at least 3 to 5 orders of magnitude faster than that of bulk phosphors. As a result, the downconverter can withstand several orders of magnitude higher excitation density without suffering from saturation in its optical output, compared to a bulk phosphor based downconverter.

9. The features outlined in items 7 and 8 make a QCA downconverter extremely attractive for application in high-power White-LED lamps with light flux output in excess of 100 lumens, where the operating temperature in vicinity of the downconverter could be in excess of 80C and the excitation intensity can be in the range of 1020 to 1021 photons per $cm^2$ per sec.

10. The development of the phosphor based on QCA's (nanophosphors) also allows us to utilize breakthroughs for the design of optical structures (e.g. photonic bandgap structures) to achieve the best coupling and the light output when integrated with solid state source (LEDs).

11. The optical design rules for the downconverter are significantly simplified compared to bulk phosphor based down converters, since the absorption of the excitation is physically decoupled from scattering of the excitation by the phosphor particles (that no longer occurs) which is present in the bulk phosphor. (For example the bulk phosphor based design rules require that the particle size be larger than the absorption length at the excitation wavelength, to minimize the loss of absorption efficiency due to scattering).

12. The optical design rules for the downconverter are significantly simplified compared to quantum-dot or band-edge emitting nanophosphors, due to one set of impurity or host related energy states being responsible for absorption and another set of impurity related energy states being responsible for the emission. This results in complete elimination of parasitic reabsorption between the different color emitting nanophosphors. (For example the quantum-dot nanophosphors experience parasitic reabsorption of the emission from shorter wavelength emitting Nanophosphor (Blue or Green ) by the longer wavelength emitting nanophosphors (Green, Orange or Red).

The nano-size luminescent QCA acts as a downconverter for UV/Blue (370–470 nm) to visible (470–700 nm). The size distribution of nanoparticle is targeted to be between 3–10 nm. Unlike the undoped nanocrystals where the absorption and emission critically depends on the size, in a QCA the emission depends only on the activator ion. This leads to well defined chromaticity needed for white light. The QCA's may be produced by the processes described in U.S. Pat. Nos. 5,637,258; 6,036,886 and U.S. Provisional Patent Application No. 60/379,726 filed May 10, 2002 (the disclosures of which are hereby incorporated by reference) or by other processes.

Representative Examples of Photonic Devices

Figure 3:
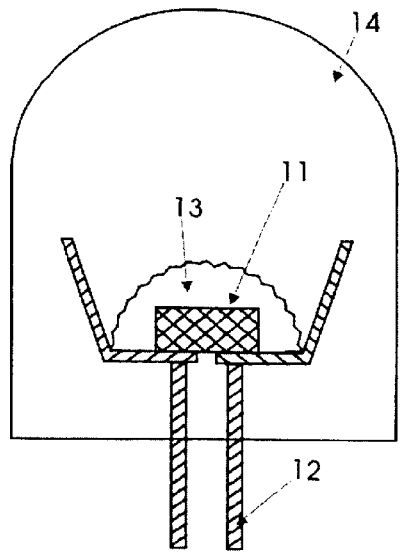
Figure 3:
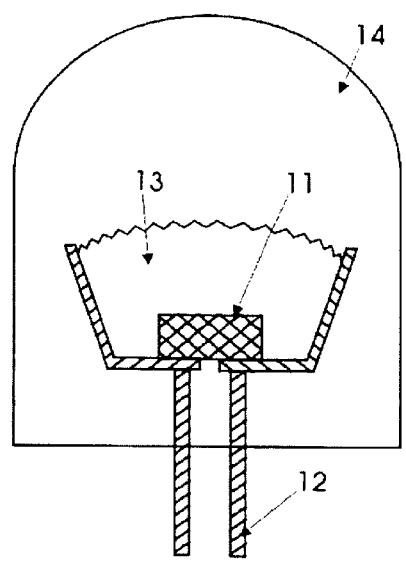
Figure 3:
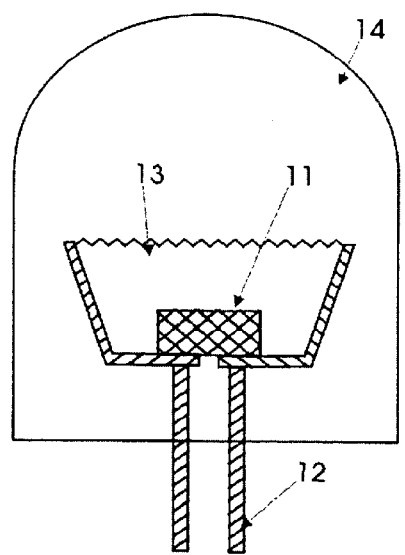
Figure 3:
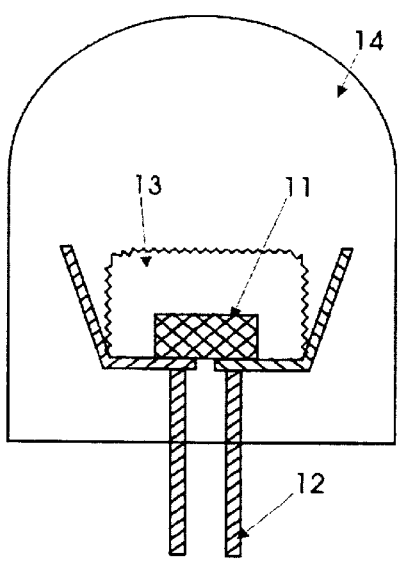

In all of the examples described below, the volume concentration of nanophosphors may or may not be spatially varied in the Nanophosphor downconverter. FIG. 1 of the drawings illustrates a first embodiment of a light emitting device constructed in accordance with the present invention, in which a nanophosphor downconverter 10 formed from the matrix materials described above is molded as a lens, and a metal lead-frame with reflector cup 12 mounts an LED chip 11. Lead frame 12 thus serves as a electrical connection as well as a reflector. FIGS. 2 and 3 of the drawings illustrates further embodiments of a light emitting device with the same reference numbers used to indicate like structure. In the embodiments of FIGS. 2 and 3 a nanophosphor downconverter 13, in a variety of configurations, is disposed within lead frame 12 with a molded epoxy lens 14 which does not contain the nanophosphor materials, which may be a high refractive index composite. In the embodiments shown in FIG. 4 nanophosphor downconverter 13 is covered with a graded refractive index layer 15 which may incorporate micro-optical elements and sub-wavelength sized photonic bandgap structures, to achieve enhanced light extraction and enhanced directionality for the visible light emission (by suppressing wave-guiding in downconverter 13).

Figure 5:
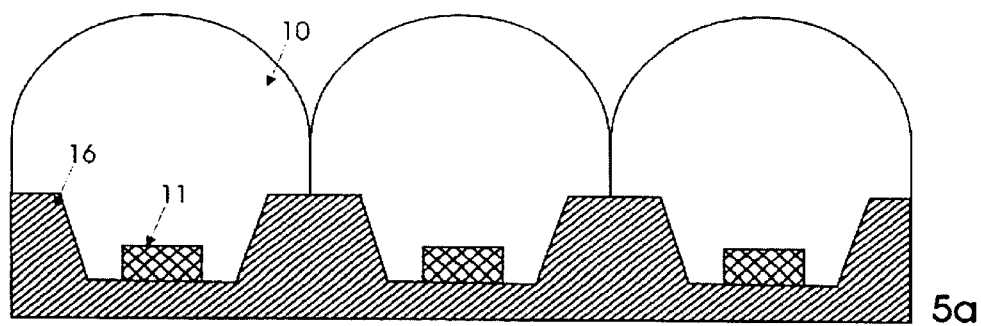
Figure 5:
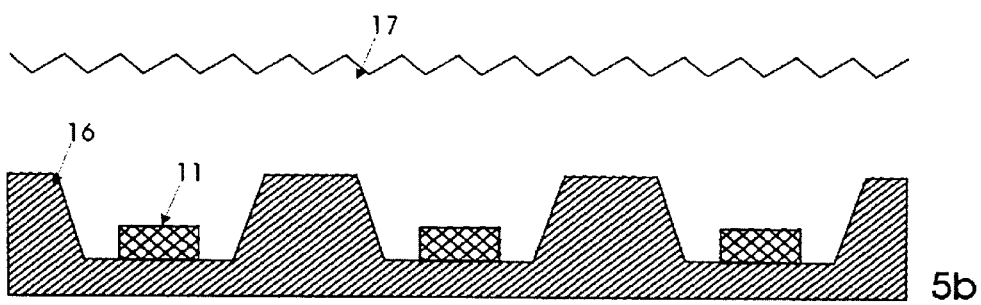
Figure 5:
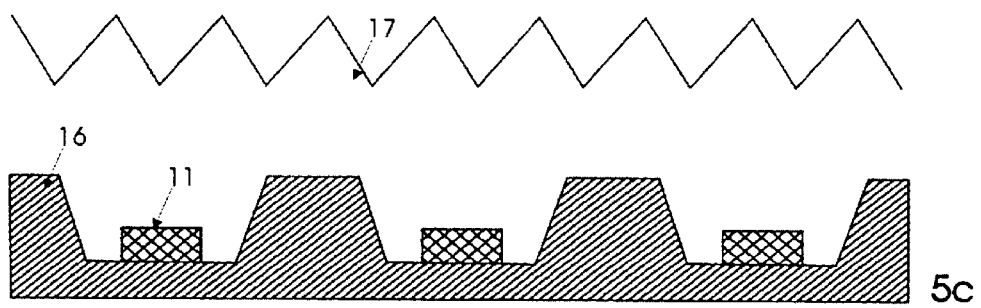

The following drawings make clear that the light emitting devices of the present invention maybe implemented on a substrate containing a multiplicity of individual LED modules. In FIG. 5a a substrate 16 with reflective cavities and a reflective surface mounts LED chips 11, surrounding each chip 11 is a nanophosphor downconverter 10 molded as a lens which is formed from the matrix materials described above. In FIGS. 5b and 5c substrate 16 mounting LED chips 11 is covered with nanophosphor downconverters 17 with microoptics formed in the upper surface. In FIGS. 6 and 7 each LED chip 11 mounted on substrate 16 is surrounded by nanophosphor downconverter 13 which in turn is covered with graded refractive index layers 15 which can incorporate micro-optical elements and/or photonic bandgap structures in a variety of configurations.

Figure 9:
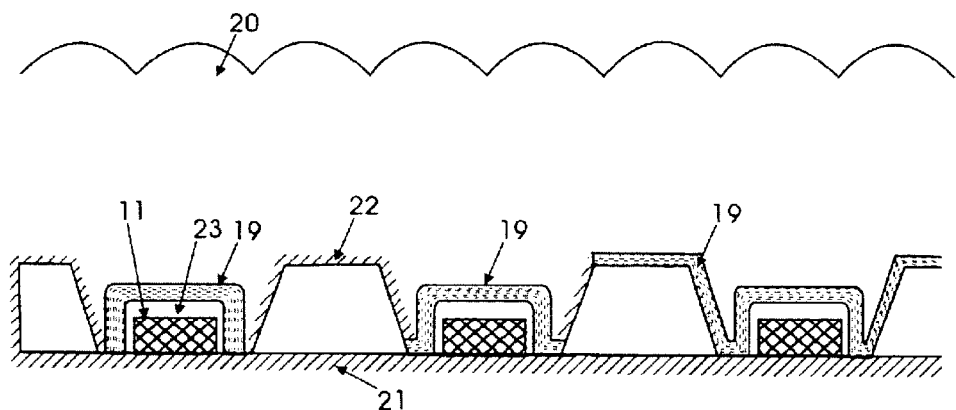
Figure 8:
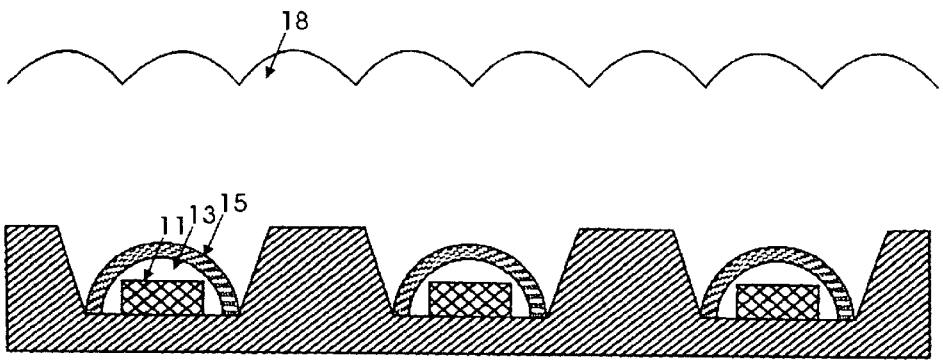
Figure 8:
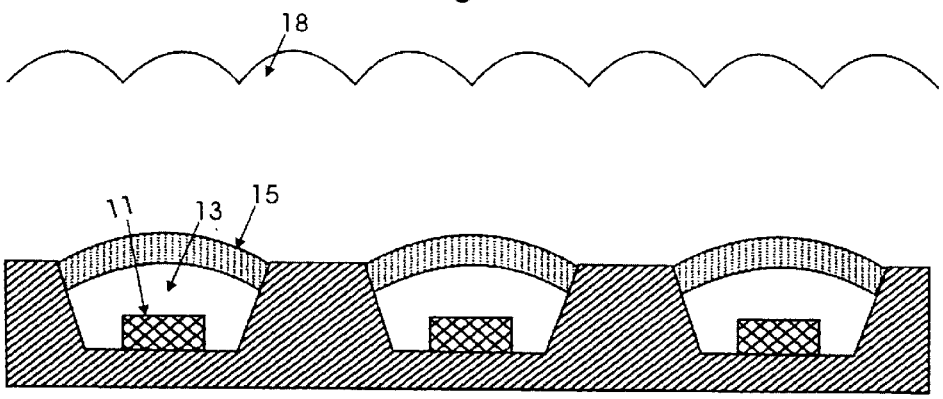

In FIG. 8 substrate 16 mounting LED chips 11 is surrounded by nanophosphor downconverters 13 which are covered with a graded refractive index layer 15 and epoxy lenses 18 with microoptics molded therein which may be a high refractive index composite. In FIG. 9 a substrate 21 with a reflective surface has a reflective coating 22, mounted in the wells of substrate are LED chips 11 which are surrounded by refractive index matching material 23 and thereafter with a coating 19 to prevent visible light and LED emissions from reentering chip 11. A molded nanophosphor downconverter 20 having microoptics and optical coatings forms the upper layer of the completed package.

In FIGS. 4, 6, 7, and 8, the following variations may also be implemented: The Nanophosphor downconverter 13 and the graded refractive index layer 15 which may incorporate microoptical elements and sub-wavelength sized photonic bandgap structures, may be interchanged such that the downconverter is not in physical contact with the LED chip. An optically transparent layer that does not emit light, but which may or may not be a high refractive index layer, such as 23 in FIG. 9, could be placed between the downconverter 13 and the LED chip. A coating to prevent visible light and LED emissions from reentering the chip, such as 19 in FIG. 9, may be placed in between the downconverter 13 and the LED chip, or in between the downconverter 13 and the optically transparent layer such as 23 in FIG. 9 in contact with the LED chip.

Integration of Nanophosphor Based Downconverters with LED Die/Chip Packages

The nanophosphor is dispersed in an optically transparent matrix material, to fabricate the downconverter, which encapsulates the LED die/chip.

The matrix material is transparent in both the UV-Visible excitation and the Visible emission wavelength regime. The refractive index of the matrix material is at least 1.5 or higher. The matrix material does not exhibit degradation of optical transparency, due to darkening or discoloration, after prolonged exposure to the UV-Visible excitation. Suitable matrix materials include, but are not limited to: Epoxy, Silica (SiOx), SiOx with a polymer such as PMMA and/or MMA, Alumina (AlOx), Silicone and a Silicone-Epoxy hybrid.

In addition to the light emitting nanophosphor particles, index matching, non light emitting nanoparticles may also incorporated into the matrix material. Such non light emitting nanoparticles, such as but not limited to zirconia; titania and group 2 chalcogenides, which can have refractive indexes of 2.0 or more will serve to raise the effective refractive index of the matrix to 1.8 or greater, which will increase the light output from the matrix even though these nanoparticles or their agglomerates (less than 40 to 30 nm in size) do not themselves emit light. The index matching, non light emitting nanoparticles may be dispersed in relatively large quantities (40 to 60% by volume) in the matrix without turning the matrix opaque since the size of the nanoparticles is smaller than the wavelengths of the emitted light and are thus "invisible" to the light. The volume % of the light emitting particles can be up to approximately 40%.

The QCA nanophosphor particles are smaller than 10 nm in size, which is more than an order of magnitude smaller than both the excitation and emission wavelengths, can be dispersed in the matrix without agglomeration by the use of ligand coating or coupling agent such as an alkyloxysilane solution applied to the nanophosphor particles. Note also that a ligand coating or coupling agent can also be applied to the non light emitting nanoparticles. This uniform or controlled variation/grading in the volume concentration of the nanophosphor particles in the matrix imparts an optical transparency to the downconverter. Even in the event that the Nanophosphor particles are agglomerated, but the size of the agglomerate is less than 40 to 30 nm, the downconverter will remain optically transparent.

The refractive index of the nanophosphor particles is typically higher than 2.0. The effective refractive index of the downconverter is higher than that of the matrix material and depends on the fractional volume concentration of the nanophosphor particles. The spatial profile of the refractive index can be adjusted, by appropriately varying the volume concentration of the nanophosphor particles, to enhance light extraction from the LED die/chip.

The nanophosphor particles and the matrix material coexist as a dispersed composite gel or liquid, prior to being converted into a solid phase, for example, by thermal curing or by photoactivated curing. The required temperature range for the curing process is compatible with the thermal budget of the packaging process. Alternately, the composite comprised of the matrix material with Nanophosphor particles dispersed in it, could remain as a compliant composite gel or liquid and offer some advantages with respect to its ability to withstand higher operating temperatures in a package containing components with mismatched thermal expansion coefficients. "Self-organization" effects can also be initiated and harnessed in this composite gel or liquid to obtain sub-wavelength sized photonic bandgap structures in the downconverter.

In instances where micron-sized agglomerates comprised of Nanophosphor particles have a lower refractive index than that of the corresponding bulk phosphor particles, dispersing the Nanophosphor agglomerates in a matrix can result in a higher optical transparency compared to a bulk phosphor dispersed in a matrix. The Nanophosphor agglomerate has effectively a lower refractive index due to the fractional volume packing of the Nanophosphor particles with void dimensions less than 40 nm (about an order of magnitude smaller than the wavelength) and the voids between the nanoparticles being comprised of a relatively lower index material such as air or matrix material. Typical packing density of Nanophosphors in an agglomerate could be on the order of 50% and in case of the phosphor material having a refractive index of ~1.8, the effective refractive index of the micron-sized agglomerate could be between 1.65 to 1.4 (depending on whether matrix or air is filled in the voids) dispersed in a matrix with refractive index 1.5. Compared to a corresponding bulk phosphor with a refractive index of ~1.8 dispersed in a matrix with refractive index 1.5, the Nanophosphor agglomerate offers significantly reduced scattering and thereby higher optical transparency.

The following approaches can be undertaken to integrate the downconverter with the LED die/chip in a package: To encapsulate a LED die/chip in a nanophosphor downconverter, the composite gel or liquid can be dispensed over the die mounted in a reflector cup and either fully or partially cured, similar to the process in which an Amine-cured or Anhydride-cured epoxy is used, to form an encapsulating lens. Alternately, the approach outlined in 1) can be implemented with an individual "lens" for each die or a "single lens" encapsulating the entire array.

In the case of a close-packed array of LED die/chip mounted on a substrate for superior heating sinking and electrical connections in high-lumen applications, the composite gel or liquid can be spin-coated and either fully or partially cured to obtain a conformal coverage of the downconverter on each die/chip in the array. This could be done with or without patterning the downconverter coating, implemented using a lift-off masking layer prior to coating the composite gel or liquid, or in case of a photocurable composite gel or liquid implemented using a photomask.

The composite gel or liquid can be molded and cured to form a "cap" structure incorporating micro-optical elements and 2-dimensional sub-wavelength sized photonic bandgap structures implemented using nano-imprinting techniques, to achieve enhanced light extraction and enhanced directionality for the visible light emission (by suppressing wave-guiding in the downconverter).

The optical elements in the structure such as for example, coatings or layers on top of the downconverter and in between the downconverter and die/chip, can also serve the purpose of enhancing the confinement of the UV-Blue excitation within the downconverter, to achieve enhanced absorption efficiency for the excitation and minimize the amount of phosphor-downconverted visible emission entering the die/chip. Alternately, the coatings or layers between the downconverter and die/chip can also serve the purpose of preventing the excitation from re-entering the die/chip, after it has been reflected back towards the die/chip by the coating on top of the downconverter. These coatings or layers may or may not contain sub-wavelength sized photonic-bandgap structures.

The molded structure with a cavity closely matched (but slightly larger) to the die/chip dimensions, would be fitted as a "cap" on top of a die/chip. For a close-packed array of LED die/chips, the molded structure can incorporate an array of cavities, closely matched to the LED die/chip pattern on the underlying substrate. Optical coupling between the LED die/chip and the downconverter is achieved by dispensing a controlled volume of the composite gel or liquid on top of the die/chip followed by insertion of the "cap" and curing of the composite gel or liquid (provided there is no volume shrinkage upon curing) or alternately, using an uncured composite gel or liquid. Alternately, a material that does not darken under UV-Blue excitation, such as Silicone, can be used for optical coupling. An higher refractive index composite comprising Silicone and non light emitting higher refractive index nanoparticles dispersed in it, can be used for optical coupling.

A more advanced version of the molded "cap" structure described above can incorporate photonic bandgap structures, such as a 2D multilayer stack comprised of dielectric layers with differing indices of refraction or 3D lattice structures whose indices of refraction differ from the matrix material, to enhance absorption of the UV-Blue excitation and enhance directionality and light extraction of the visible emission. These sub-wavelength structures can be realized using "self-organization" effects amongst the Nanophosphor particles and the matrix material. This would decrease the requirements of additional process steps such as nano-imprinting and molding/machining of the micro-optical elements. A downconverter with integrated optical elements and photonic bandgap structures can enable reduced form-factor packages with a higher lumen output per unit area, due to the reduced complexity of the primary optics in the package.

The composite gel or liquid can be injected into a package to fill in the volume between the LED die/chip and an optically clear encapsulating hollow shell or lens. The shell which serves to physically contain the composite gel or liquid and is capable of retaining its shape. The shell could be composed of, but not limited to, glass, acrylate, epoxy, silicone and silicone-epoxy hybrid.

Performance Enhancement Offered by
Nanophosphor Luminescent Downconverter

At the present time, the conventional bi-phosphor or tri-phosphor blends synthesized for white-light generation with UV-Violet excitation around 400 nm, have a lumen output of ~375 to 350 lm/W based on the spectral characteristic of the phosphor emission.

These conventional phosphors which have been engineered for 400 nm excitation, do not simultaneously exhibit both high Absorption Efficiency (A.E) and high Quantum Efficiency (Q.E). For example, for phosphors with Q.E ~90% the measured A.E ~50% to 60%. This in contrast to desired A.E values in the 80% to 90% range.

As a consequence of the low absorption, in order to prevent the wasteful "bleed-through" of the unabsorbed 400 nm excitation, the thickness of the conventional phosphor-blend layer around the LED die/chip is larger than what is optimal from a light extraction standpoint. The thicker phosphor layer leads to higher scattering of the visible emission by the phosphor particles, resulting in the absorption of a larger fraction of the visible emission at lossy surfaces in the die/chip or package. The lower transparency of the thicker phosphor layer, due to scattering, results in a smaller light extraction efficiency for the visible emission. The optical efficiency of the package, resulting from the scattering, non-transparent phosphor downconverter layer is about 50%.

Luminous Efficacy values around 0.80 lm/W per 1% LED lamp wall plug efficiency (20 lm/W for 25% LED lamp wall plug efficiency), have been observed using conventional phosphor blends engineered and coupled to 400 nm LEDs. This implies light extraction efficiency values around 50%. Light extraction efficiency values around 85% are routinely achieved using thinner phosphor layers (4 to 5 particles thick) for phosphors with higher A.E for 254 nm and e-beam cathodoluminescent excitation.

The high optical transparency of the Nanophosphor downconverter for the visible emission enables a high light extraction efficiency, with values around 85% being achievable. The intrinsically high absorption of the excitation by the Nanophosphor particles and the absence of scattering by the particles, enables A.E in the 80% to 90% range. This enables Luminous Efficacy values around ~1.8 lm/W per 1% excitation LED lamp wall plug efficiency. This would result in 45 lm/W from the currently available 25% wall plug efficient excitation LED lamp. This is more than a 100% improvement, and could be further enhanced by a reduction in the number of components in the optical system. Incorporation of the higher refractive index material in immediate vicinity of the die/chip and encapsulating the downconverter, would result in an additional improvement of 30% to 50% depending on the geometry and optical design of the die/chip (For increasingly advanced optical designs of future generation die/chip this increase could be less pronounced. However if higher performance of future generation die/chip is entirely based on improvements in the semiconductor material, then the extent of the above improvement is still valid ). This would amount to 60 to 65 lm/W from the currently available 25% wall plug efficient excitation LED lamp.

Luminous Efficacy values around 1.8 lm/W per 1% excitation LED lamp wall plug efficiency (45 lm/W for 25% excitation LED lamp wall plug efficiency), have been observed using conventional phosphor blends engineered and coupled to 470 nm LEDs. This implies light extraction efficiency values around 50% for the package. Enhanced light extraction efficiency values, due to a transparent downconverter would lead to a 50% enhancement resulting in ~2.7 lm/W per 1% excitation LED lamp wall plug efficiency. This would amount to 60 to 65 lm/W from the currently available 25% wall plug efficient excitation LED lamp. Incorporation of the higher refractive index material in immediate vicinity of the die/chip and encapsulating the downconverter, would result in an additional improvement of 30% to 50% depending on the geometry and optical design of the die/chip (For increasingly advanced optical designs of future generation die/chip this increase could be less pronounced. However if higher performance of future generation die/chip is entirely based on improvements in the semiconductor material, then the extent of the above improvement is still valid ) resulting in ~3.5 lm/W per 1% excitation LED lamp wall plug efficiency. This would amount to 85 to 90 lm/W from the currently available 25% wall plug efficient excitation LED lamp.

In addition to YAlG:Ce other suitable metal oxide hosts for production by the present process include terbium aluminum garnet doped with cerium (TbAlG:Ce), yttrium oxide ($Y_2O_3$), zirconium oxide ($ZrO_2$), zinc oxide (ZnO), titanium oxide (TIO2), gadolinium oxide ($Gd_2O_3$), praseodymium oxide ($Pr_2O_3$), lanthanum oxide ($La_2O_3$), and copper oxide and their alloys. Suitable dopants include the rare earth elements, (europium, terbium, thulium, cerium, gadolinium, holmium, samarium and neodymium). The transition metals (manganese, copper, silver, cobalt, nickel, and iron) may also be used as activators for various applications.

The invention has been described with respect to preferred embodiments. However, as those skilled in the art will recognize, modifications and variations in the specific details which have been described and illustrated may be resorted to without departing from the spirit and scope of the invention.

What is claimed is:

1. A photonic structure for emission of white light under excitation by an LED, comprising:
   a) a radiation emitting diode;
   b) an optically transparent matrix material disposed so as to intercept the light emitted by said diode; and
   c) nanocrystalline phosphors dispersed within said matrix material, that will emit light upon excitation by the radiation of the diode.

2. The photonic structure as claimed in claim 1 wherein the nanocrystalline phosphors comprise individual nanoparticles having an average diameter of less than 20 nm.

3. The photonic structure as claimed in claim 1 wherein the nanocrystalline phosphors comprise optically-nonscattering agglomerates of individual nanoparticles having an average diameter of less than 40 nm.

4. The photonic structure as claimed in claim 1 wherein the nanocrystalline phosphors comprise optically-scattering agglomerates of individual nanoparticles having an average diameter of greater than 40 nm and the matrix material has a index of refraction generally equal to that of the optically-scattering agglomerates of individual nanoparticles.

5. The photonic structure as claimed in claim 1 wherein the optically transparent matrix material surrounds said diode.

6. The photonic structure as claimed in claim 1 wherein the matrix material is selected from the group consisting of: epoxy, silica, silica with a polymer, alumina, silicone and silicone-epoxy hybrids.

7. The photonic structure as claimed in claim 1 wherein the optically transparent matrix material includes a dispersion of non-light emitting nanoparticles for raising the refractive index of the matrix material.

8. The photonic structure as claimed in claim 1 further including a substrate to which multiple diodes are mounted.

9. The photonic structure as claimed in claim 1 wherein the diodes and the matrix are disposed within a light reflector.

10. The photonic structure as claimed in claim 1 wherein the diodes emit 370–470 nm radiation.

11. The photonic structure as claimed in claim 1 wherein the nanocrystalline phosphors comprise separate phosphors that emit red, green and blue light upon excitation by the radiation of the diode.

12. The photonic structure as claimed in claim 1 wherein the diode is at least one of a blue emitting diode and a UV emitting diode.

13. The photonic structure as claimed in claim 1 wherein the nanocrystalline phosphors comprise at least one of: yttrium aluminum garnet doped with cerium and terbium aluminum garnet doped with cerium.

14. The photonic structure as claimed in claim 13 wherein the diode is a blue emitting diode.

15. The photonic structure as claimed in claim 1 further including a reflector disposed proximate to at least one of said radiation emitting diode and said optically transparent matrix material.

16. The photonic structure as claimed in claim 15 wherein said reflector also functions as an electrical connection to said radiation emitting diode.

17. The photonic structure as claimed in claim 1 wherein the diode and the nanocrystalline phosphors comprise complementary colors.

18. The photonic structure as claimed in claim 1 wherein the nanocrystalline phosphors comprise multiple wavelength phosphors.

19. A photonic structure for emission of white light under excitation by an LED, comprising:
   a) a substrate;
   b) a plurality of radiation emitting diodes, disposed on said substrate;
   c) an optically transparent matrix material disposed so as to intercept the light emitted by said diodes; and
   d) nanocrystalline phosphors dispersed within said matrix material, that will emit light upon excitation by the radiation of the diodes.

20. The photonic structure as claimed in claim 19 wherein the optically transparent matrix material includes a dispersion of non-light emitting nanoparticles for raising the refractive index of the matrix material.

21. The photonic structure as claimed in claim 19 wherein the nanocrystalline phosphors comprise separate phosphors that emit red, green and blue light upon excitation by the radiation of the diode.

22. The photonic structure as claimed in claim 19 wherein matrix material forms lenses.

23. A photonic structure for emission of white light under excitation by an LED, comprising:
   a) a radiation emitting diode;
   b) an optically transparent matrix material disposed so as to intercept the light emitted by said diode;
   c) phosphors dispersed within said matrix material, that will emit light upon excitation by the radiation of the diode; and
   d) non light emitting non-scattering nanoparticles dispersed within said matrix material so as to match the index of refraction of the matrix material to that of the phosphors.

24. The photonic structure as claimed in claim 23 wherein non light emitting non-scattering nanoparticles dispersed within said matrix material have an agglomerate size of less than 40 nm.

* * * * *